United States Patent
Schaetzle et al.

(10) Patent No.: US 10,530,241 B2
(45) Date of Patent: Jan. 7, 2020

(54) DRIVER CIRCUIT FOR INTRINSICALLY SAFE CIRCUITS

(71) Applicant: VEGA Grieshaber KG, Wolfach (DE)

(72) Inventors: Ralf Schaetzle, Fischerbach (DE); Albert Woehrle, Aichhalden (DE)

(73) Assignee: VEGA Grieshaber KG, Wolfach (DE)

( * ) Notice: Subject to any disclaimer, the term of this patent is extended or adjusted under 35 U.S.C. 154(b) by 411 days.

(21) Appl. No.: 15/432,596

(22) Filed: Feb. 14, 2017

(65) Prior Publication Data

US 2017/0250598 A1    Aug. 31, 2017

(30) Foreign Application Priority Data

Feb. 25, 2016    (DE) .................. 10 2016 203 014

(51) Int. Cl.
| | |
|---|---|
| *G01R 31/00* | (2006.01) |
| *H02M 1/32* | (2007.01) |
| *H02M 1/08* | (2006.01) |
| *H02M 1/00* | (2006.01) |

(52) U.S. Cl.
CPC .............. *H02M 1/32* (2013.01); *H02M 1/08* (2013.01); *H02M 2001/0009* (2013.01); *H02M 2001/0048* (2013.01)

(58) Field of Classification Search
USPC ............................................. 324/509–512
See application file for complete search history.

(56) References Cited

U.S. PATENT DOCUMENTS

| | | | | |
|---|---|---|---|---|
| 5,085,574 | A | * | 2/1992 | Wilson ................ F23N 5/242 126/39 N |
| 7,804,199 | B2 | * | 9/2010 | Vegter ................ F16K 31/004 307/116 |
| 8,922,096 | B2 | | 12/2014 | Beck et al. |
| 9,054,724 | B2 | | 6/2015 | Schaetzle et al. |
| 2016/0043560 | A1 | | 2/2016 | Marks |

FOREIGN PATENT DOCUMENTS

| | | |
|---|---|---|
| DE | 38 16 862 C1 | 10/1989 |
| DE | 44 26 908 B4 | 5/2004 |
| DE | 10 2009 023 318 B3 | 12/2010 |
| DE | 10 2014 011 723 A1 | 2/2016 |
| EP | 2 246 984 B1 | 7/2013 |
| WO | WO 2016/019982 A1 | 2/2016 |

* cited by examiner

*Primary Examiner* — Vincent Q Nguyen
(74) *Attorney, Agent, or Firm* — Oblon, McClelland, Maier & Neustadt, L.L.P.

(57) ABSTRACT

A driver circuit for an electric device of an intrinsically safe circuit is provided, including a coupling capacitor configured to be open to AC voltage signals and to decouple DC voltage signals, the coupling capacitor includes first and second terminals, and is electrically connected to a first output line of the driver circuit by the first terminal; a first circuit configured to detect an output current of the coupling capacitor, which flows from the first terminal to the first output line; a switchable element electrically connected to the second terminal; a switching behaviour of the element being controllable by switching the element from an electrically blocking state to an electrically conductive state when the output current at the first terminal exceeds a predefined threshold, so that the element in the conductive state causes discharge of the coupling capacitor via the second terminal.

12 Claims, 1 Drawing Sheet

DRIVER CIRCUIT FOR INTRINSICALLY SAFE CIRCUITS

CROSS-REFERENCE TO RELATED APPLICATION

This application claims the benefit of the filing date of German Patent Application No. 10 2016 203 014.0 filed on 25 Feb. 2016, the entire content of which is incorporated herein by reference.

FIELD

The invention relates to a driver circuit for processing and supplying electric signals for an electric device, in particular for a fill level measuring device, a pressure measuring device, or a flow rate measuring device, of an intrinsically safe circuit and to an intrinsically safe circuit with a corresponding driver circuit.

BACKGROUND

The intrinsic safety of a technical system is a property which ensures, for example, by means of or due to special principles of construction that an unsafe state does not occur even in the case of a fault in the technical system. This can be achieved by various different measures so that the risk of a dangerous situation occurring is minimised as far as possible. In general, a fault can be described as a situation in which there is a risk or the danger that a risk may occur. In particular and by way of example, such a risk can be defined as the possibility of producing a spark when closing an electric circuit in areas where there is a risk of explosion.

An intrinsically safe circuit generally consists of a power supply, a driver circuit, and an electric device. The driver circuit is supplied with electric power by the power supply and generates a control signal and/or a power supply signal and transmits said signal to the electric device.

Electronic devices and apparatuses in intrinsically safe circuits, in particular during their use or intended use in atmospheres or environments that are at risk of explosion, can be limited in their power consumption by resistors in the supply line in order to avoid the formation of an ignitable spark, so that there is absolutely no risk of an explosion occurring.

In many electronic systems, AC voltage signals are used to modulate a signal and transmit said signal to an electric device. For decoupling (in particular for DC decoupling) the AC voltage signals capacitors can be used (so-called coupling capacitors). In this case, however, it has to be ensured that the power stored in the capacitor is not dissipated in any way in the case of a fault (e.g., with the sudden discharge of the capacitor) such that an ignitable spark is formed.

SUMMARY

It has been acknowledged that when using coupling capacitors and to prevent the formation of an ignitable spark in the case of faults, series resistors are often used, which have a high resistance value. The resistance value is calculated from the voltage and current values used and from how high the current leaving the device is permitted to be (and/or a voltage at the output of the device) in order to prevent the occurrence of an event to be avoided. Said series resistors are typically connected upstream of the output of the driver circuit in the direction of the electric device, so that an electric signal at the output of the driver circuit cannot cause an ignitable spark. Similarly, it has been recognised that said high resistances have the disadvantage that the AC voltage signal, which is transmitted by the driver circuit to the electric device, is also damped. In other words, not only is an unwanted signal damped in case of a fault, but also the intended useful signal of the driver circuit. However, this approach requires the driver circuit to amplify the useful signal so that the level of the signal after damping by the series resistor is still sufficiently high in order to be recognised and used by the electric device to be controlled. Alternatively, the receiving electric device can be provided with a suitably sensitive receiver circuit. However, it is not always possible to modify the driver circuit or the receiving electric device so that for said functions additional modules (e.g., an amplifier module on the side of the driver circuit or a receiver module connected upstream of the electric device) are used, which can however have a negative effect on the complexity of the system and the power consumption.

On the basis of these findings there is a need to reduce the complexity and the power consumption of a driver circuit for an intrinsically safe circuit.

According to an embodiment, a driver circuit is specified for processing and supplying electric signals for an electric device of an intrinsically safe circuit. The electric device is, for example, a fill level measuring device, a flow rate measuring device, or a pressure sensor.

The driver circuit comprises a coupling capacitor, which is designed to be open to AC voltage signals and to decouple DC voltage signals, wherein the coupling capacitor comprises a first terminal, and is electrically connected to a first output line of the driver circuit by said first terminal. Furthermore, the driver circuit comprises means for detecting an output current of the coupling capacitor (so-called output current detection device), wherein the output current flows from the first terminal of the coupling capacitor to the first output line of the driver circuit. Furthermore, the driver circuit comprises a switchable element which is electrically connected at least indirectly to a second terminal of the coupling capacitor. Furthermore, the driver circuit comprises means for controlling the switching behaviour of the switchable element (so-called switching behaviour control device), wherein said means are designed to switch the switchable element from an electrically blocking state into an electrically conductive state when the output current of the coupling capacitor at the first terminal reaches or exceeds a predefinable threshold, so that the switchable element in the electrically conductive state causes a discharge of an electric charge of the coupling capacitor via the second terminal.

Intrinsically safe circuits are used in environments where the consequences of a fault in or on the circuit can have catastrophic consequences. For example, intrinsically safe circuits are used in environments where there is a risk of explosion, in which, in the case of a fault in the intrinsically safe circuit, it is necessary to prevent the formation of a spark, which could lead to an explosion.

A driver circuit can be defined as an operating device or a signal processing unit for an electric device of an intrinsically safe circuit. The driver circuit can comprise a control unit, which provides control signals or commands for the electric device, and which are transmitted from the driver circuit to the electric device. The driver circuit is typically constructed so that from said circuit, even in the case of a fault, no undesirably high current is discharged, which may cause the formation of a spark outside the driver circuit.

The first terminal of the coupling capacitor is connected at least indirectly to the first output line, i.e., additional components can be arranged between the first terminal and the output line. In one variant, the first terminal of the coupling capacitor can also be connected directly to the first output line. The first terminal can be referred to as the output of the coupling capacitor.

The second terminal of the coupling capacitor can be referred to as the input of the coupling capacitor and, in particular, can be connected to the modulator unit of the driver circuit.

In an embodiment, the driver circuit can comprise two output lines, which transmit signals from the driver circuit to the electric device and back. Of these two output lines, however, only one can be charged with current or voltage potential by means of the driver circuit. This one output line is the aforementioned first output line. The first output line is used for transmitting the electric signals from the intrinsically safe circuit to the electric device.

The switchable element can respectively adopt one of at least the two states of being electrically blocking or electrically conductive. The switchable element is electrically blocking when it is not open to current in switching direction (on the connected line) and is electrically conductive if it allows a current to flow on the connected line. The means for controlling the switching behaviour of the switchable element can comprise a plurality of elements which influence the switching behaviour on interaction with one another, i.e., switch the switchable element from the conductive state to the blocking state or vice versa.

By way of the means for detecting the output current of the first terminal (the output) of the coupling capacitor, it is possible that, in the case of a fault in the intrinsically safe circuit in the capacitor, any possible electric charge that flows in the form of an electric current via the first terminal to the output line is detected. By means of the arrangement of the switchable element (this can also be referred to as a sequential circuit) and by changing the state of the switchable element, the flow of the electric charge of the coupling capacitor via the second terminal is made possible. In other words, there is thus a discharge of the coupling capacitor within the intrinsically safe circuit and the charge of the coupling capacitor is not discharged outwardly (to the first terminal line). Thus, the risk of sparks forming outside the intrinsically safe circuit from a sudden discharge of the coupling capacitor can be reduced or prevented.

A functional aspect of the driver circuit described herein is not to allow a charge of the coupling capacitor to be driven outwards from the driver circuit and to use up or consume said charge internally in order to prevent an external spark from forming or to prevent the risk of said spark forming. This aim is achieved in that the flow of current from the coupling capacitor in the direction of the used device (sensor) is monitored (the monitoring of the current flow is performed by using a current sensing resistor, implicitly in that the voltage falling across the current sensing resistor varies according to the current flow and is an indicator of the current flowing through the current sensing resistor) and on reaching or exceeding a threshold value (that is, the limit value which cannot be exceeded and above which there is risk of spark formation), a circuit is closed through which the coupling capacitor can be discharged internally.

According to an embodiment, the means for detecting the output current of the coupling capacitor at the first terminal comprises a first Ohmic resistor, which is arranged between the first terminal of the coupling capacitor and the first output line of the driver circuit.

The first Ohmic resistor can be referred to as a current sensing resistor. The voltage falling across the current sensing resistor is thus proportional to the current flowing therethrough. In this way, by having recourse to said voltage, it is possible in a simple manner to determine the current that the coupling capacitor outputs at its first terminal. In an embodiment, the first Ohmic resistor can consist of one or more components. For example, the function or the purpose of said first Ohmic resistor can be achieved by a connection in series, or a connection in parallel, or by a combined series/parallel connection of individual components.

According to an embodiment, the switchable element is designed as a semiconductor element, which, according to a control signal, can be switched out of the electrically conductive state into the electrically blocking state and vice versa, wherein the semiconductor element comprises a connected or switchable line, the electric resistance of which can be varied according to the control signal that is applied to a control input of the semiconductor element.

The semiconductor element can be a transistor that comprises a control input, which is designed to influence, via a control signal applied at the control input, the flow of current over a connected line.

The connected line consists in turn of two additional terminals of the semiconductor element, namely an input and an output, and the electric resistance between the input and output is varied by means of a control signal (current or voltage) at the control input so that the varied electric resistance of the connected line shifts said line into the electrically conductive state (low resistance of the connected line) or electrically blocking state (high resistance of the connected line).

In an embodiment, the means for controlling the switching behaviour of the switchable element, i.e., the semiconductor element, are formed from the interaction of the current and/or voltage signal at the control input relative to the current and/or voltage signals at at least one other terminal of the semiconductor element. This means that two potentials can be set relative to one another. At a bipolar transistor, which has a base, a collector, and an emitter, said potential can be the difference in potential between the base and the emitter.

According to an embodiment, the switchable element comprises a bipolar transistor. In this embodiment, the connected line runs from the collector to the emitter.

According to an embodiment, the driver circuit also comprises a collector resistor, which is arranged between a first terminal of the bipolar transistor and the second terminal of the coupling capacitor.

The first terminal of the bipolar transistor is its collector terminal. The collector resistor is designed in particular to limit the power consumption of the bipolar transistor at the collector and to divert the charge of the coupling capacitor in case of a fault. The collector resistor can have a resistor value of several kilo-Ohms, for example 3 kilo-Ohms to 10 kilo-Ohms.

According to an embodiment, a second terminal of the bipolar transistor is connected to the first terminal of the coupling capacitor.

The second terminal of the bipolar transistor is the so-called emitter terminal. By means of this structure, the charge of the coupling capacitor in case of a fault is guided via the collector resistor and the collector emitter line of the bipolar transistor to the second terminal of the coupling capacitor, and the charge of the coupling capacitor is used up internally, i.e., in the driver circuit, without being emitted at the first terminal line to the electric device and the supply device.

According to an embodiment, the driver circuit also comprises a base resistor, which connects the first output line to a third terminal of the bipolar transistor.

The emitter terminal of the bipolar transistor is connected via the current sensing resistor to the first output line, whilst the base terminal of the bipolar transistor is connected via the base resistor to the first output line. If the current through the current sensing resistor, and thus from the coupling capacitor to the first output line, exceeds a predefined limit value, the voltage falling across the current sensing resistor changes so that the potential at the emitter of the transistor also changes. In this way, as a result and according to the measurement of the current sensing resistor, the base emitter voltage of the transistor and thus also the resistor on the collector emitter line changes. As a result of this, the base emitter line is conductive or blocking, specifically according to the change in the base emitter voltage.

According to an embodiment, the driver circuit also comprises a control unit and a modulator unit, wherein the control unit is designed to generate a control signal and transmit said signal to the modulator unit, which is designed in turn to modulate the received control signal and emit said signal to the coupling capacitor.

According to an embodiment, an intrinsically safe circuit is provided, which comprises a power supply, an electric device, and a driver circuit as described above and in the following. In this case, the power supply is arranged to supply the driver circuit with electric power and the driver circuit is designed to provide a control signal for the electric device and to transmit the control signal via the first output line to the electric device. The control signal can be a digital control signal for example.

According to an embodiment, the electric device is a sensor for detecting a physical parameter.

DETAILED DESCRIPTION OF EMBODIMENTS

Figure 1:
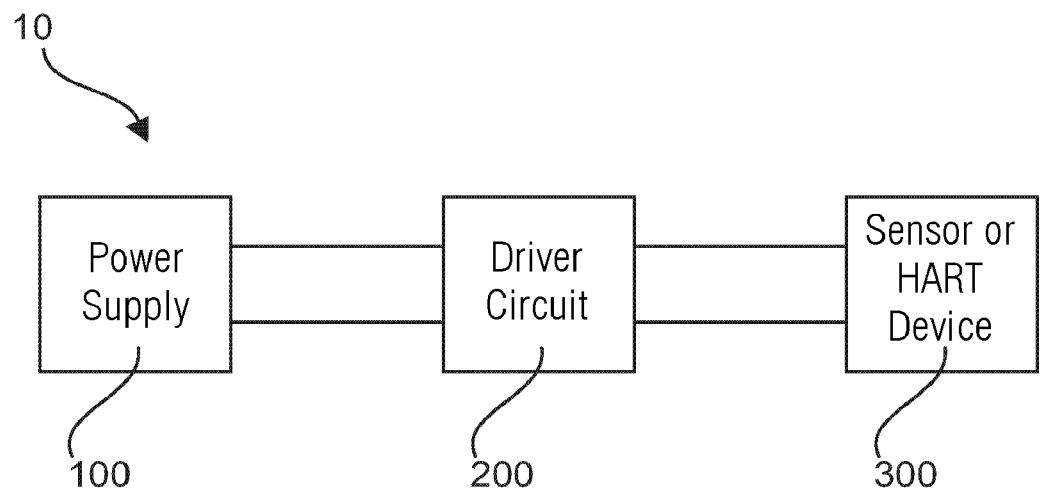
FIG. 1 is a schematic view of an intrinsically safe circuit according to an embodiment.

FIG. 1 shows an intrinsically safe circuit 10, which may be part of a sensor, with a power supply 100 (in particular a current source), a driver circuit 200, and an electric device 300. The power supply 100 supplies the driver circuit 200 and has corresponding limiting elements (e.g., the limiting resistor 110; cf. FIG. 2). In this way, it is ensured that predefined values for voltage, current, and output to the driver circuit are not exceeded.

The driver circuit 200 is supplied by the power supply 100 and generates a control signal for the electric device 300, e.g. a sensor, or a HART (Highway Addressable Remote Transducer) operating device supplied by a current loop and a 4 . . . 20 mA HART sensor. The driver circuit can use a predetermined communication or transfer protocol for communication with the electric device.

Figure 2:
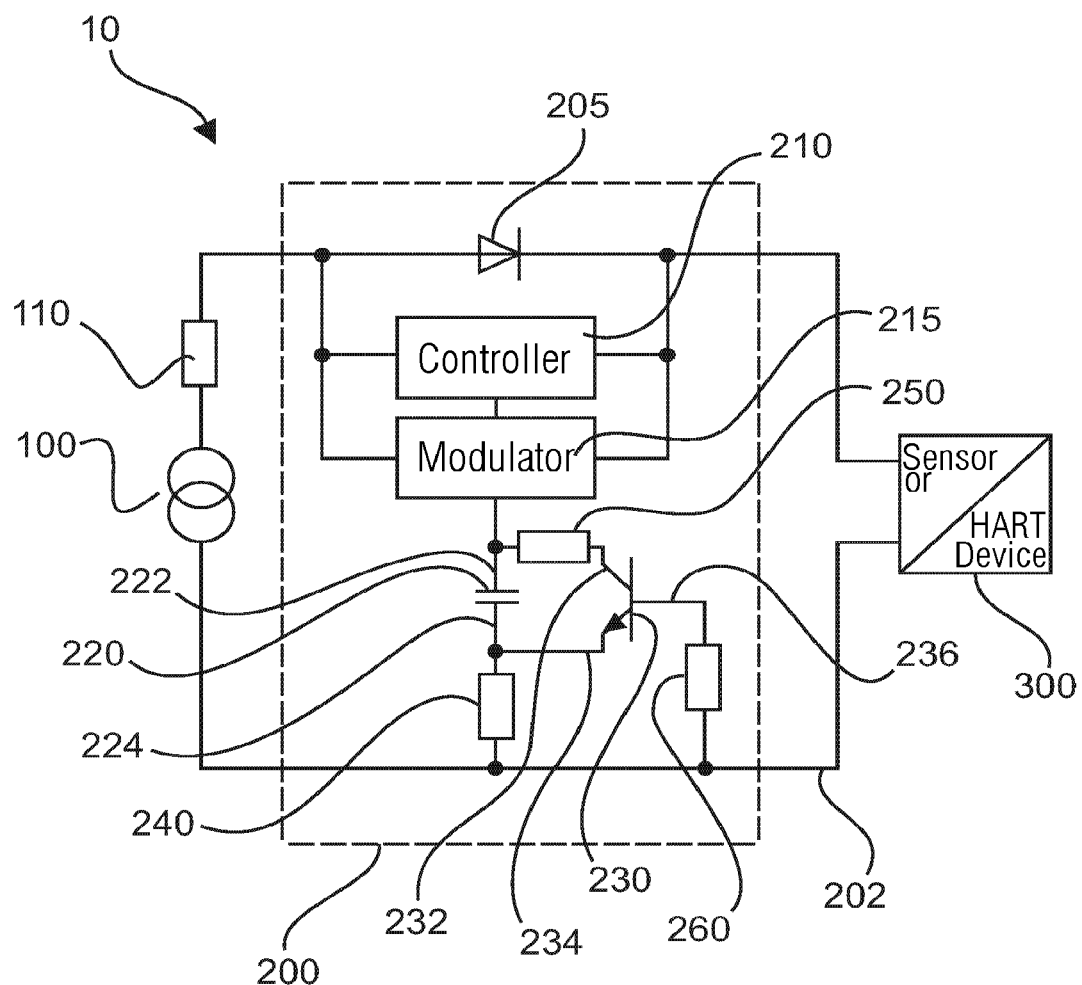
FIG. 2 is a schematic view of a driver circuit according to an embodiment.

FIG. 2 is a detailed view of a driver circuit 200, which is integrated into an intrinsically safe circuit 10.

The driver circuit 200 is provided for processing and supplying electric signals for the electric device 300 of the intrinsically safe circuit 10. The driver circuit comprises a coupling capacitor 220, a circuit 240 for detecting the output current (i.e., so that the output current flows through the means, as in the particular case in which the circuit for detecting the output current is a current sensing resistor), a switchable element 230 in the form of a bipolar transistor, and means for controlling the switching behaviour of the switchable element 230. The means for controlling the switching behaviour can be in particular the arrangement of the base resistor 260 and the emitter resistor 240 and their functional interaction with the base terminal of the bipolar transistor 230.

The coupling capacitor 220 is designed to be open to AC voltage signals and to decouple DC voltage signals, wherein the coupling capacitor comprises a first terminal 224, and is electrically connected to a first output line 202 of the driver circuit 200 by said first terminal. The means 240 for detecting an output current of the coupling capacitor, i.e., circuit or current sensing resistor, detect the current that flows from the first terminal 224 of the coupling capacitor 220 to the first output line 202 of the driver circuit 200. The switchable element 230 is electrically connected at least indirectly to a second terminal 222 of the coupling capacitor.

The driver circuit 200 comprises a diode 205, which provides the necessary drop in voltage for supplying the components of the driver circuit with power. For digital communication with the electric device, a control unit 210 and a modulator unit 215 are provided and the digital signal is modulated by means of the coupling capacitor 220. The coupling capacitor can be charged in the case of a fault to the maximum voltage, which provides the power supply. This stored power can be output in case of further faults, for example a short circuit at the connection terminals of the electric device 300, by the driver circuit and produce an ignitable spark. To prevent this, a current sensing resistor 240 is inserted between the first terminal 224 of the coupling capacitor and the first output line 202 of the driver circuit. The current sensing resistor 240 ensures that in the case of sufficiently high discharge current of the coupling capacitor via its first terminal 224, the potential difference between an emitter and base of the transistor 230 increases and the transistor switches from the blocking state into the conductive state, i.e., lowers the resistance of the collector emitter line. In this way, the charged coupling capacitor 220 is discharged rapidly via the second terminal 222 and the transistor discharge current stage. The discharge current of the coupling capacitor discharges internally in the driver circuit 200 via the switchable element (transistor) 230 and is not output to the first output line 202 and the electric device 300. In this way, it is possible to prevent an ignitable spark being formed. It is also possible by means of this circuit that the resistor value of the current sensor resistor 240 can be selected to be comparatively small (few or several 10 Ohms, between 10 Ohms and 100 Ohms), so that additional amplification of the control signal of the driver circuit or processing of the signal is not necessary on the part of the electric device 300.

The means 240 for detecting the output current of the coupling capacitor 220 at the first terminal 224 comprise a first Ohmic resistor, which is arranged between the first terminal 224 of the coupling capacitor and the first output line 202 of the driver circuit 200.

The switchable element 230 is designed as a semiconductor element (in particular a bipolar transistor, in particular a so-called npn-transistor), which can be switched, according to a control signal, from the electrically conductive state to the electrically blocking state and vice versa, wherein the semiconductor element comprises a connected path between the collector 232 and emitter 234, the electric resistor of which can be varied according to the control signal which is applied to a control input (base) 236 of the semiconductor element.

The driver circuit 200 comprises a collector resistor 250, which is arranged between the first terminal 232 of the bipolar transistor and the second terminal 222 of the coupling capacitor 220. The second terminal 222 of the coupling capacitor is the terminal by means of which the coupling capacitor is connected to the control unit 210 and the modulator unit 215.

The driver circuit comprises a base resistor 260, which connects the first output line 202 to the third terminal (base) 236 of the bipolar transistor 230.

In addition, it should be noted that "including" and "comprising" do not exclude any other elements or steps and the indefinite articles "a" or "an" do not exclude a plurality. Furthermore, it should be noted that features or steps which have been described with reference to one of the above embodiments can also be used in combination with other features or steps of other aforementioned embodiments. The reference numerals in the claims should not be considered to be limiting.

LIST OF REFERENCE NUMERALS

10 intrinsically safe circuit
100 power supply
110 series resistor
200 driver circuit
202 first output line
205 diode
210 control unit
215 modulator unit
220 coupling capacitor
222 second terminal
224 first terminal
230 switchable element
232 first terminal (collector)
234 second terminal (emitter)
236 third terminal (control terminal, base)
240 means for detecting the output current of the coupling capacitor
250 collector resistor
260 series resistor of the control terminal
300 electric device

We claim:

1. A driver circuit configured to process and supply electric signals for an electric device of an intrinsically safe circuit, the driver circuit comprising:
   a first output line;
   a coupling capacitor, which is open to AC voltage signals and configured to decouple DC voltage signals, the coupling capacitor comprising a first terminal and a second terminal, and being electrically connected to the first output line of the driver circuit by the first terminal;
   a first circuit configured to detect an output current of the coupling capacitor, which flows from the first terminal of the coupling capacitor to the first output line of the driver circuit;
   a switchable element electrically connected to the second terminal of the coupling capacitor;
   a second circuit configured to control a switching behaviour of the switchable element, and to switch the switchable element from an electrically blocking state to an electrically conductive state when the output current of the coupling capacitor at the first terminal reaches or exceeds a predefined threshold value, so that the switchable element in the electrically conductive state causes the discharge of an electric charge of the coupling capacitor via the second terminal; and
   a controller and a modulator, wherein the controller is configured to generate a control signal and to transmit the control signal to the modulator, and wherein the modulator is configured to modulate a received control signal and to emit the modulated signal to the coupling capacitor.

2. The driver circuit according to claim 1, wherein the first circuit configured to detect the output current of the coupling capacitor at the first terminal comprises a first Ohmic resistor disposed between the first terminal of the coupling capacitor and the first output line of the driver circuit.

3. The driver circuit according to claim 1,
   wherein the switchable element is a semiconductor element configured to switched from the electrically conductive state to the electrically blocking state and vice versa according to a control signal, and
   wherein the semiconductor element comprises a control input and a connected line including an electric resistor configured to vary according to the control signal applied to the control input.

4. The driver circuit according to claim 3, wherein the switchable element comprises a bipolar transistor.

5. The driver circuit according to claim 4, further comprising a collector resistor disposed between a first terminal of the bipolar transistor and the second terminal of the coupling capacitor.

6. The driver circuit according to claim 4, wherein a second terminal of the bipolar transistor is connected to the first terminal of the coupling capacitor.

7. The driver circuit according to claim 4, further comprising a base resistor connecting the first output line to a third terminal of the bipolar transistor.

8. An intrinsically safe circuit, comprising:
   a power supply;
   a driver circuit according to claim 1; and
   an electric device,
   wherein the power supply is configured to supply the driver circuit electric current, and
   wherein the driver circuit is configured to provide a control signal to the electric device and to transmit the control signal via the first output line to the electric device.

9. The intrinsically safe circuit according to claim 8, wherein the elects device is a sensor configured to detect a physical parameter.

10. The intrinsically safe circuit according to claim 9, wherein the sensor is a fill level measuring device, a pressure measuring device, a limit level measuring device, a density measuring device, or a flow rate measuring device.

11. A sensor for detecting a physical parameter, comprising a driver circuit according to claim 1.

12. The sensor according to claim 11, wherein the sensor is a fill level measuring device, a pressure measuring device, a limit level measuring device, a density measuring device, or a flow rate measuring device.

* * * * *